(12) United States Patent  
Gruber et al.

(10) Patent No.: US 8,528,805 B2  
(45) Date of Patent: Sep. 10, 2013

(54) METHOD AND APPARATUS PROVIDING FINE ALIGNMENT OF A STRUCTURE RELATIVE TO A SUPPORT

(75) Inventors: Peter A. Gruber, Mohegan Lake, NY (US); Philip Charles Danby Hobbs, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/292,260

(22) Filed: Nov. 9, 2011

(65) Prior Publication Data

US 2012/0052263 A1  Mar. 1, 2012

Related U.S. Application Data

(62) Division of application No. 12/955,038, filed on Nov. 29, 2010, now Pat. No. 8,104,668, which is a division of application No. 11/624,830, filed on Jan. 19, 2007, now Pat. No. 7,841,510.

(51) Int. Cl.
*B23K 31/00* (2006.01)
*B23K 31/02* (2006.01)

(52) U.S. Cl.
USPC ........ 228/228; 228/233.1; 228/102; 228/103; 257/738

(58) Field of Classification Search
USPC ............... 228/228, 233.1, 102, 103; 257/738
See application file for complete search history.

(56) References Cited

U.S. PATENT DOCUMENTS

| | | | |
|---|---|---|---|
| 5,184,767 A * | 2/1993 | Estes ............................. | 228/56.3 |
| 5,244,143 A | 9/1993 | Ference et al. ........... | 228/180.21 |
| 5,569,960 A | 10/1996 | Kumazawa et al. .......... | 257/738 |
| 6,131,795 A | 10/2000 | Sato .............................. | 228/102 |
| 6,149,122 A | 11/2000 | Berger et al. ................. | 249/119 |
| 6,294,745 B1 | 9/2001 | Gruber .......................... | 174/263 |
| 6,355,298 B1 | 3/2002 | Wah et al. ......................... | 427/8 |
| 6,443,631 B1 | 9/2002 | Case et al. ..................... | 385/91 |
| 6,666,368 B2 | 12/2003 | Rinne ...................... | 228/180.22 |
| 2004/0074950 A1 | 4/2004 | Grieder et al. ........... | 228/180.22 |
| 2006/0124705 A1 | 6/2006 | Kuczynski et al. ........... | 228/221 |

OTHER PUBLICATIONS

"Solder for microwave assemblies", Internet article, Soldering Basics—Microwave Encyclopedia—Microwaves101.com, Jun. 14, 2006, 3 pgs.

"Database for Solder Properties with Emphasis on New Lead-free Solders, Properties of Lead-Free Solders", Release 4.0, Internet article, part 1—Mechanical Properties, National Institute of Standards & Technology and Colorado School of Mines, Feb. 11, 2002, 2 pgs.

"Table 2.2.19. Lead-Free Solder Alloys, Solidus and Liquidus Temperatures, Coefficient of Thermal Expansion, Surface Tension, and Electrical Resistivity", Internet article, Part 2—Thermal properties, Jun. 14, 2006, 3 pgs.

"Polymer-Core Solder Balls: An Alternative to Solid Solder Balls?", Internet article, www.circuitreecom, Jun. 14, 2006, 3 pgs.

* cited by examiner

*Primary Examiner* — Keith Walker
*Assistant Examiner* — Erin Saad
(74) *Attorney, Agent, or Firm* — Harrington & Smith

(57) ABSTRACT

A method for fine positioning a component through the use of fusible elements having two or more melting points so as to establish intermediate displacements between totally melted fusible elements and unmelted fusible elements. Because of the use of non-eutectic fusible materials, fine adjustments in the displacement may be achieved.

10 Claims, 9 Drawing Sheets

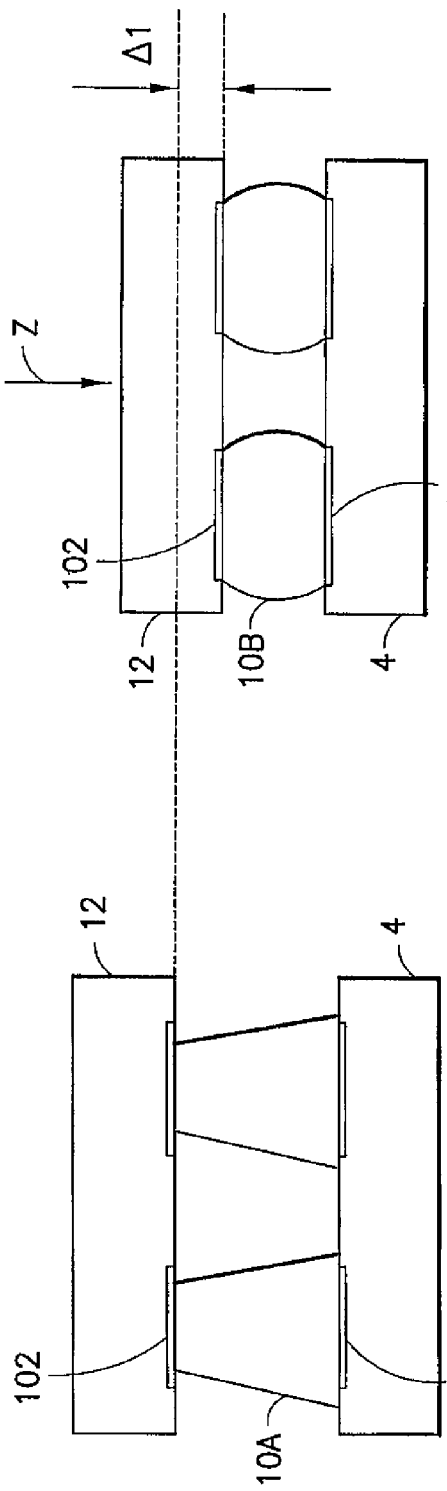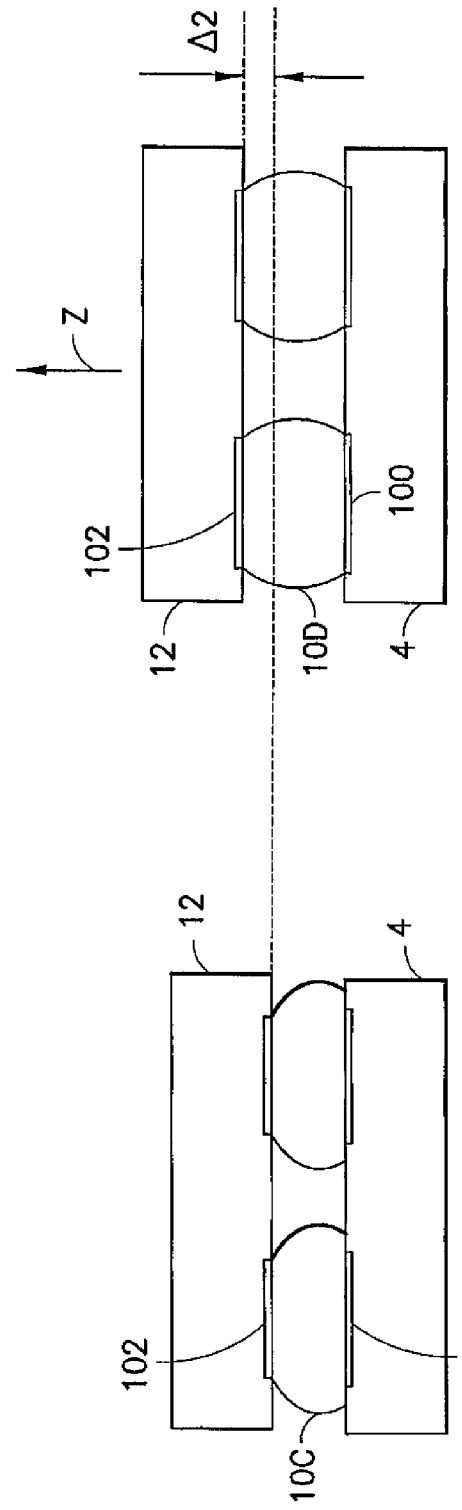

MEASURE TARGET Δ

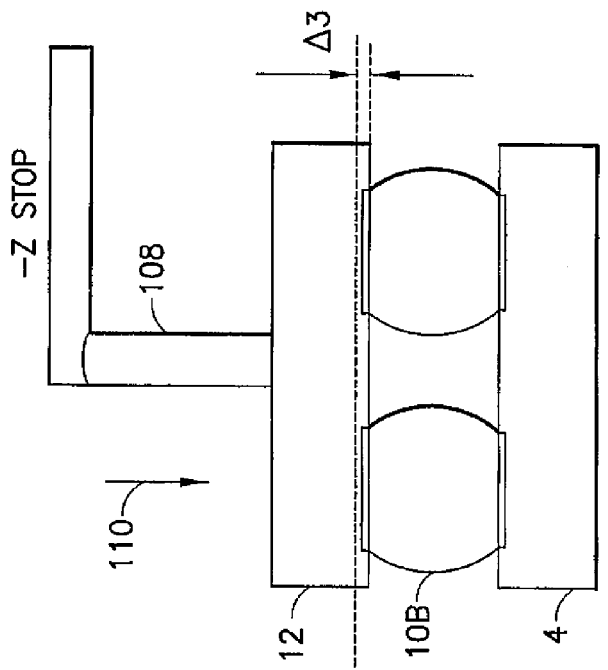
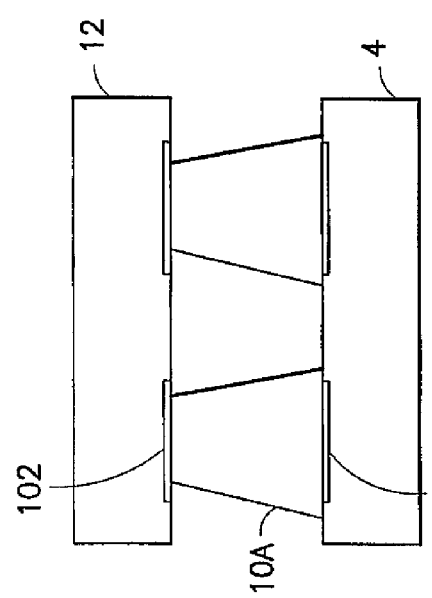
FIG.9B
FIG.9A

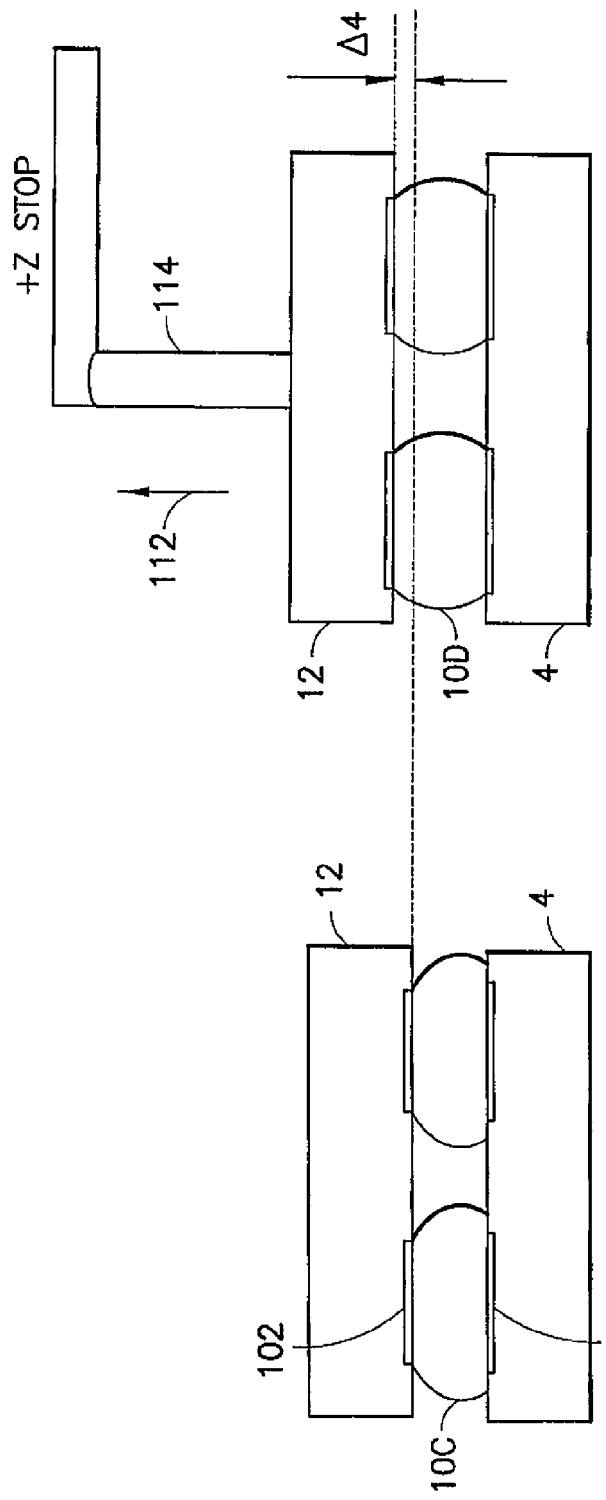

METHOD AND APPARATUS PROVIDING FINE ALIGNMENT OF A STRUCTURE RELATIVE TO A SUPPORT

CROSS REFERENCE TO RELATED APPLICATIONS

This application is a divisional of U.S. patent application Ser. No. 12/955,038 filed on Nov. 11, 2010, which is a divisional of U.S. patent application Ser. No 11/624,830, filed on Jan 19, 2007, and also claims priority to U.S. patent application Ser. No. 12/536,175, filed on Aug. 5, 2009.

BACKGROUND OF THE INVENTION

1. Field of the Invention

The exemplary embodiments of this invention relate to the field of mechanical alignment techniques and, more particularly, to precision alignment techniques for components, such as optical and integrated circuit components.

2. Brief Description of Prior Developments

Interconnection techniques are of increasing concern in micro component systems. Within three product generations, it is projected that electrical interconnections will become a severe bottleneck in server development and performance. Optical interconnections may offer a solution, but factors such as stability and cost pose hurdles in the use of optical interconnection technology. Many problems that impede implementing optical interconnections center around the mechanical alignment of lasers, detectors, and optical connectors. These alignment schemes are costly and can require the use of high precision mechanical parts.

Fusible elements, such as 'C4' solder balls, are widely used for flip chip bonding of ICs to substrates, and do provide for some automatic alignment of optical and micro-electromechanical systems due to their self-centering property, as well as provide for bonding. However, fusible elements are not currently used for fine positioning because they represent, at best, a two-state process in that they are of a first size before melting and of a second size after melting.

There is a need for fine position adjustment for optical and micro electromechanical devices and components.

SUMMARY OF THE INVENTION

In a first exemplary aspect of the invention, a method for positioning an object is provided comprising applying a plurality of materials between a component to be positioned and a supporting base which displacement is to be measured against; heating the plurality of materials to achieve a desired displacement between the component to be positioned and the supporting base, wherein the desired displacement is achieved through the extent the plurality of materials melt.

In a second exemplary aspect of the invention, an apparatus is provided comprising an applicator; a supporting base upon which more than one non-eutectic material is applied on at least a portion of the supporting base by the applicator; a placement mechanism for disposing a component onto the more than one non-eutectic material on the supporting base; and a heat source for melting the non-eutectic material in a controlled manner, thereby changing the displacement between the component and the supporting base.

In a third aspect of the invention, a support base and component arrangement comprises a support base with a mounting area; fusible material on the mounting area, the fusible material having a non-eutectic characteristic; and a component that is bonded to the support base through the fusible material, wherein the fusible material establishes an adjustable displacement between the mounted component and the support base in proportion to the extent the fusible material is melted.

In a fourth aspect of the invention, a method is provided, using a eutectic solder alloy array, comprising measuring a target offset between the component and the supporting base on which it will be placed through fusible material; selecting an appropriate decal containing fusible elements of the correct volume; applying the fusible elements to the supporting base by heating the fusible elements and thereafter removing the decal; and attaching the component to the supporting base by reheating the fusible elements.

In a fifth aspect of the invention using a eutectic solder alloy array, a method is provided comprising attaching a component to a supporting base through fusible elements by holding the component with a Z (i.e. vertical) stop fixture; heating the fusible elements to achieve a positive or negative displacement; and stopping Z displacement of the component relative to the supporting base when a desired target offset is reached by holding the component with the Z stop fixture in place while cooling the fusible elements to lock in the target offset.

BRIEF DESCRIPTION OF THE DRAWINGS

The foregoing and other aspects of these teachings are made more evident in the following Detailed Description, when read in conjunction with the attached drawings, wherein:

FIGS. 1C and 1D are enlarged views of the structure;

FIGS. 5A-5D illustrate examples of fusible element preform shapes in accordance with exemplary embodiments of the invention;

FIGS. 9A-9B illustrate a method of the invention with a Z stop which halts the vertical motion bringing a component and a supporting base closer together through surface tension effects of fusible alloys; and FIGS. 9C-9D illustrate a method of the invention with a Z stop which halts the vertical motion bringing a component and a supporting base further apart through surface tension effects of fusible alloys.

DETAILED DESCRIPTION

Figure 1A:
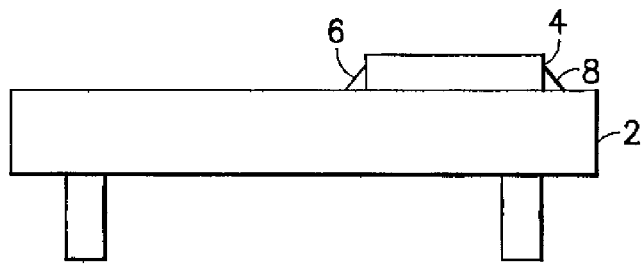
FIGS. 1A to 1D illustrate an embodiment of a structure of a supporting base, fusible elements, and component at various stages of formation in the invention where
Figure 1B:
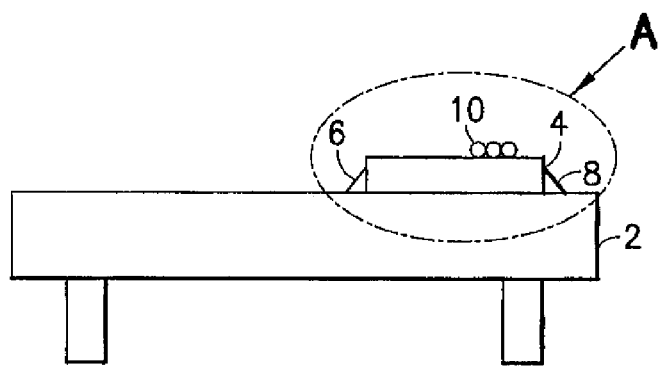

Non-limiting embodiments of the invention are further described below. However, it should be appreciated that some of the features of the embodiments of the invention could be used to advantage without the corresponding use of other features. As such, the ensuing description should be considered as merely illustrative of the principles of the invention, and not in limitation thereof. Further, one skilled in the art will appreciate that the invention can be practiced by other than the described embodiments; and that these described embodiments are presented for the purposes of illustration and not of limitation.

The exemplary embodiments of this invention relate to a positioning and spatial alignment technique which takes advantage of surface tension of small liquefiable bonding materials or fusible elements, such as solder. In an exemplary embodiment, an axial motion actuator for aligning, for example, optical and micro-electromechanical (MEM) devices uses the surface tension characteristics of fusible elements of different compositions. For example, by choosing at least the sizes and shapes of fusible elements, the axial position of a device may be adjusted by increasing its ambient temperature to a value between the solidus and liquidus temperatures of the fusible element materials. Although the discussion of the invention may refer to solder materials, the exemplary embodiments of the invention is not be construed as being limited to solder materials. Furthermore, the invention is not to be construed to be limited to the use of an axial actuator, but may be considered as a positioning technique that relies on the force generated by a graduated liquefaction of bonding materials.

The exemplary embodiments of this invention relate to a method, apparatus, and arrangement to overcome positioning problems of the prior art by exploiting thermomechanical properties of fusible elements, such as solder balls, to allow intermediate states, and hence intermediate positions from a state with completely unmelted fusible elements to a state with completely melted fusible elements. In an embodiment of a method, injection-moulded solder (IMS) is used, in which the fusible element is preformed by casting in a reusable mould such as one made from a laser-drilled polyimide sheet. Examples of IMS are described in U.S. Pat. Nos. 5,244,143; 6,149,122; and 6,294,745 which are hereby incorporated by reference in their entirety. The fusible element preforms (e.g., solder preforms) here take the shape of the mould cavities and may be shaped, as non-limiting examples, as pyramids, cones, pills, cylinders, washers, discs, rectangles, squares, spheres, stars, and the like. The fusible element preforms align with pads on the chip and the substrate (which may be a circuit board or a mezzanine-level package such as a multi-chip module). The fusible element preforms may be dispensed from a tray, palette, tape and reel, or other medium. The exemplary embodiments of the invention exploit this property as will be described below.

When surface tension develops from melting the fusible elements, the liquefied fusible element material reshapes itself to minimize its surface energy. FIGS. 5A-5B and FIGS. 5C-5D illustrate two types of fusible element preforms and their effect on the displacement between a supporting base 4 and a component 12 after fully melting. Depending on the initial shape of the fusible element preform, the displacement between the supporting base 4 and the component 12 may be increased or decreased through a full or partial melting. In FIGS. 5A-5B, the conical shaped preforms 10A are seen to result in a decrease of the displacement Δ1 as fully melted fusible elements 10B, along, for example, the Z axis. As seen in FIG. 5A, the preform 10A has a base which is larger than the contact pad 100 on the supporting base 4. The preform has a top which is smaller than the contact pad 102 on the component 12. As the preform 10A is melted, surface tension of the fusible element with the contact pads 100, 102 cause the shape of the preform to change as shown in FIG. 5B; the base of the fusible element 10B being reduced and the top of the fusible element 10B expanding relative to the preform 10A. In this embodiment, this results in the decreased displacement Δ1 between the component 12 and the supporting base 4. In FIGS. 5C-D, the hemispherical shaped preforms 10C are seen to result in an increase of the displacement Δ2 as fully melted fusible elements 100D, along, for example, the Z axis. As seen in FIG. 5C, the preform 10C has a base which is larger than the contact pad 100 on the supporting base 4. The preform 10C has a top which is equal to or larger than the contact pad 102 on the component 12. As the preform 10C is melted, surface tension of the fusible element with the contact pads 100, 102 cause the shape of the preform 10C to change as shown in FIG. 5D; the base of the fusible element 10D being reduced and the top of the fusible element 10D being reduced or staying the same relative to the preform 10C. In this embodiment, this results in the increased displacement Δ2 between the component 12 and the supporting base 4.

Figure 1C:
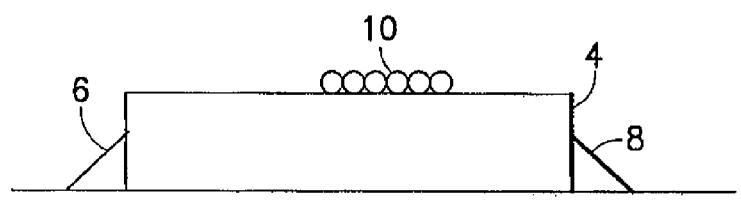
Figure 1D:
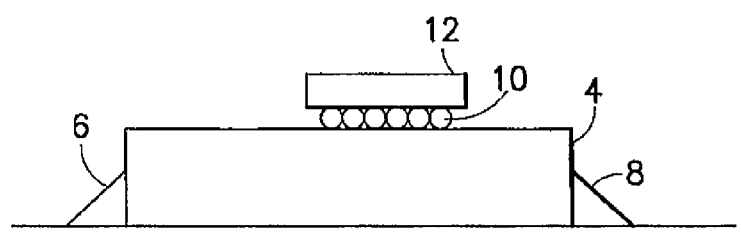

FIGS. 1A to 1D illustrate an embodiment of a method of the invention in which a structure that includes a component 12 and a supporting base 4 is formed using fusible elements 10. FIGS. 1C and 1D represent enlarged views of the encircled region A of FIG. 1B. Initially, the supporting base 4, may be secured through clamps 6, 8 or the like to, for example, a table 2. The supporting base 4 may be a platform, a circuit board, or a substrate. The table 2 may offer vibration free support through vibration isolation and/or may also offer a level support surface for the supporting base 4. Fusible elements 10 may be dispensed onto designated areas, such as bond pads, of the supporting base 4. The fusible elements 10 may be vacuum placed, electrostatically positioned, or placed by gas or air jets, as non-limiting examples. Flux may be selectively placed on the designated areas to ensure initial retention of the dispensed fusible elements 10. A fusible element dispenser may shake or vibrate the fusible elements to aid in achieving a desired distribution of types of fusible elements on a bonding pad. The fusible elements 10 may be solder balls with different compositions, where at least two of the compositions have different melting points. A solder ball is a three-dimensional spherically or non-spherically shaped mass of solder alloy which may range in size from a diameter of less than 1 mm. (e.g., about 0.1 mm., about 0.3 mm., or even as small as about 5 nm.) to several mm. In an embodiment where the fusible elements 10 are solder balls, if the solder is preformed in a non-spherical opening in a non-wetting material, but has a free surface, then upon melting it assumes a near-spherical shape. The force it can exert is considerable, due to the high surface tension of the molten solder. A second surface, such as provided by the component 12, initially in contact with the solder preform, experiences a force from the molten solder, but little or none from solder in the semi-melted range, between its solidus and liquidus temperatures because of surface tension dampening effects of dendritic scaffolding (described below). When two wetted surfaces are involved, the solder surface forms a shape that is approximately a hyperboloid of revolution, depending on the solder volume, surface separation, and the shapes of the wettable pads on each surface.

Figure 3A:
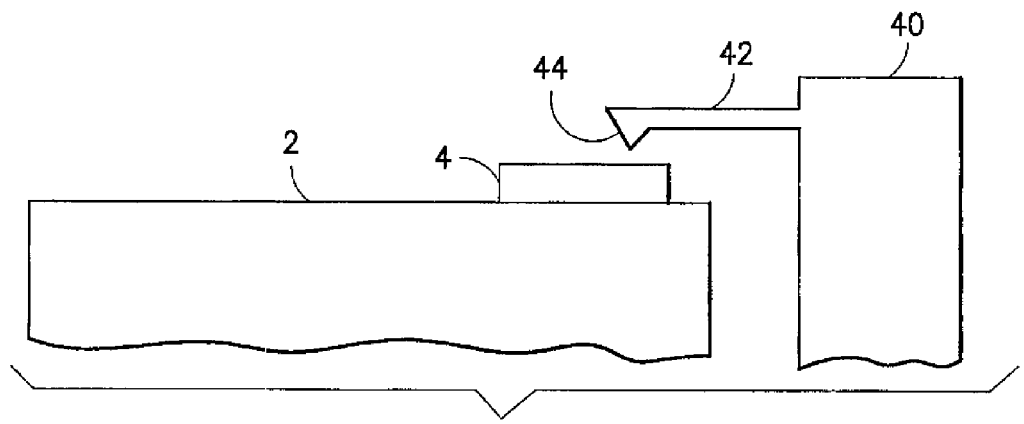
FIG. 3A to 3C illustrate yet another embodiment of a method of the invention.
Figure 3B:
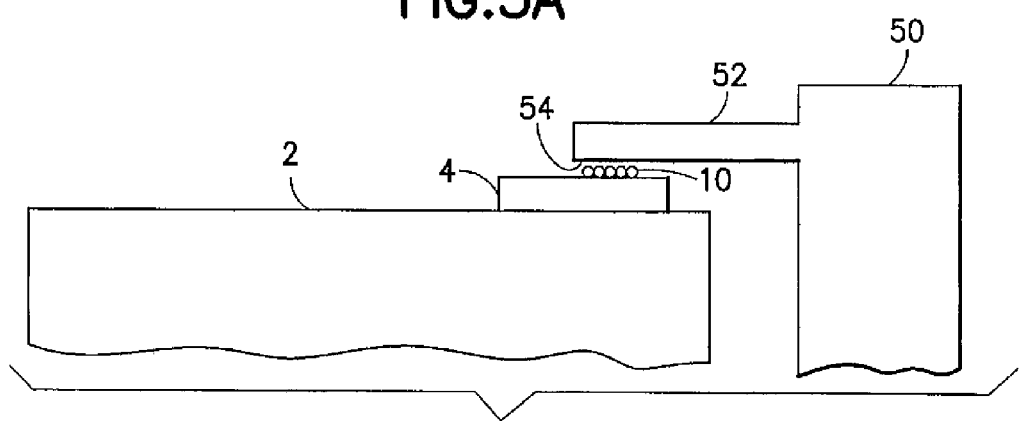
Figure 3C:
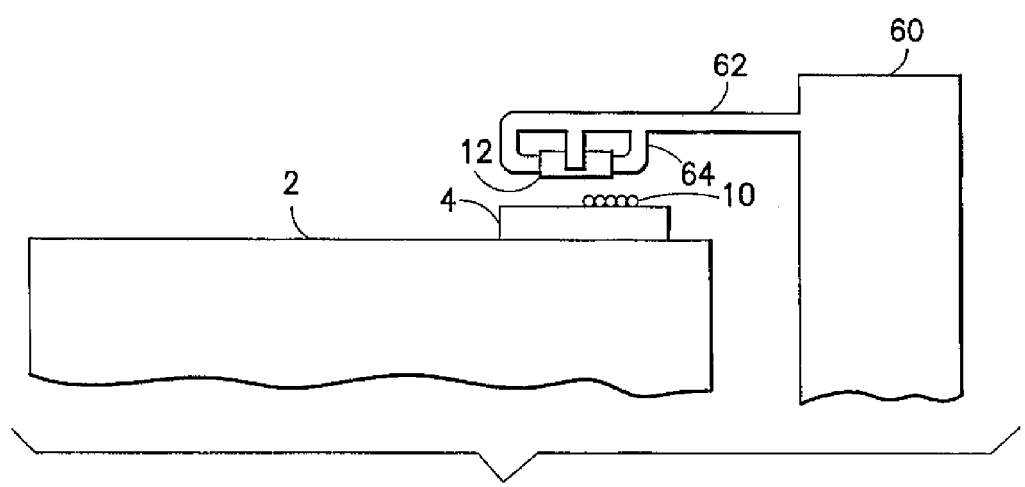

FIGS. 3A to 3C illustrate another embodiment of a method of the invention. After a supporting base 4 is secured or positioned on a table 2 or platform or the like, flux may be applied in small droplets onto designated areas of a bonding pad 5 through a flux dispenser 44. The dispenser may be moved in relation to the supporting base 4; for example, by means of an arm 42 from dispensing equipment 40. After placement of the flux, solder balls 10 of various compositions may be distributed onto the supporting base, especially, on or in proximity to the bonding pads 5 with flux. Distribution may proceed from a dispenser; for example, from a fusible element dispenser 54 mounted to an arm 52 of a solder ball dispensing equipment 50. The solder balls may be mixed together so as to ensure an even distribution of solder balls 10 with different melting points on the bonding pads 5. After the solder balls 10 are placed onto the bonding pads 5, the component 12 may be positioned onto the solder balls 10; for example, as shown in FIG. 3C, through use of a mechanical clasp 64 positioned by an arm 62 from a component positioning device 60. The component is a physical three-dimensional object that may be an electronic, a mechanical, an optical, or micro electromechanical device or constituent element of an electronic, mechanical, or optical system. A heating process for melting the solder balls is initiated to establish a desired displacement of the component 12 from the supporting base 4 (e.g., due to Δ1 of FIG. 5A and Δ2 of FIG. 5B).

Alternative methods for placement of the fusible elements (e.g., solder balls) onto the supporting base and the component onto the fusible elements are contemplated by the exemplary embodiments of this invention, including mounting the fusible elements and component(s) onto a supporting base from inside an apparatus that dispenses flux, fusible elements and one or more components. The supporting (or, reference) base may be secured before or after the component is mounted to it.

Figure 6A:
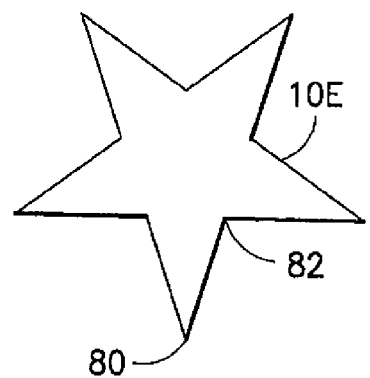
FIGS. 6A and 6B illustrate top and side views of an embodiment of a star shaped fusible element.
Figure 6B:
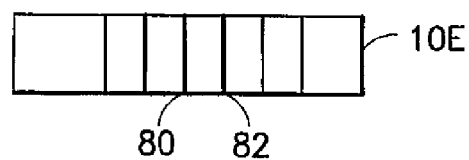
Figure 7:
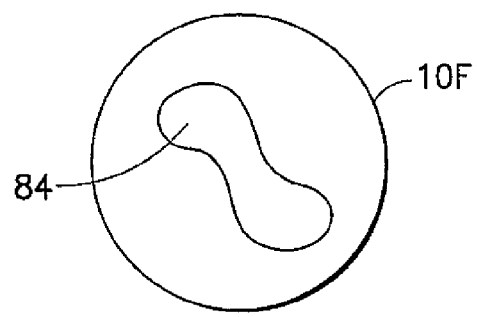
FIG. 7 illustrates an embodiment of a fusible element with a hollow cavity.

An exemplary embodiment of this invention is considered where the fusible elements 10 function as a Z-axis vertical axis actuator. The Z-axis in this embodiment refers to the direction normal to the planar extension of the supporting base with general reference to the surface of the earth. The Z-axis may be the direction that is most strongly directed against the pull of gravity. In certain embodiments, the actuator may operate to displace a component from a reference base in any direction, since the effect of gravity may be ignored due to the fact that the effects of surface tension sufficiently outweigh the effects of gravity over the dimensions of interest herein. The force applied by the fusible elements depends on the derivative of the surface area with respect to the Z-axis, so changing the shape of the preform and the wetted pad area changes the spring rate as a function of the Z-axis. For example, a star-shaped preform 10E with an arm having a tip 80 and base 82, as illustrated by top view FIG. 6A and side view FIG. 6B, may initially exert a large force, since a small change in the Z-axis changes the lengths of the star's arms considerably, whereas a hole with a complicated shape, e.g. one with voids 84 inside the preform 10F, as illustrated in FIG. 7, may initially exert a low force but switch to a much larger force when the solder surface reaches a void, since the effective surface area of the preform may then be increased because of the linkage of the surface area of the void with the external surface area of the melting preform. A void or hole shape in a preform, as illustrated by FIG. 7, can produce a controlled force that may be varied according to the Z-axis displacement.

Fine Motion

Figure 2:
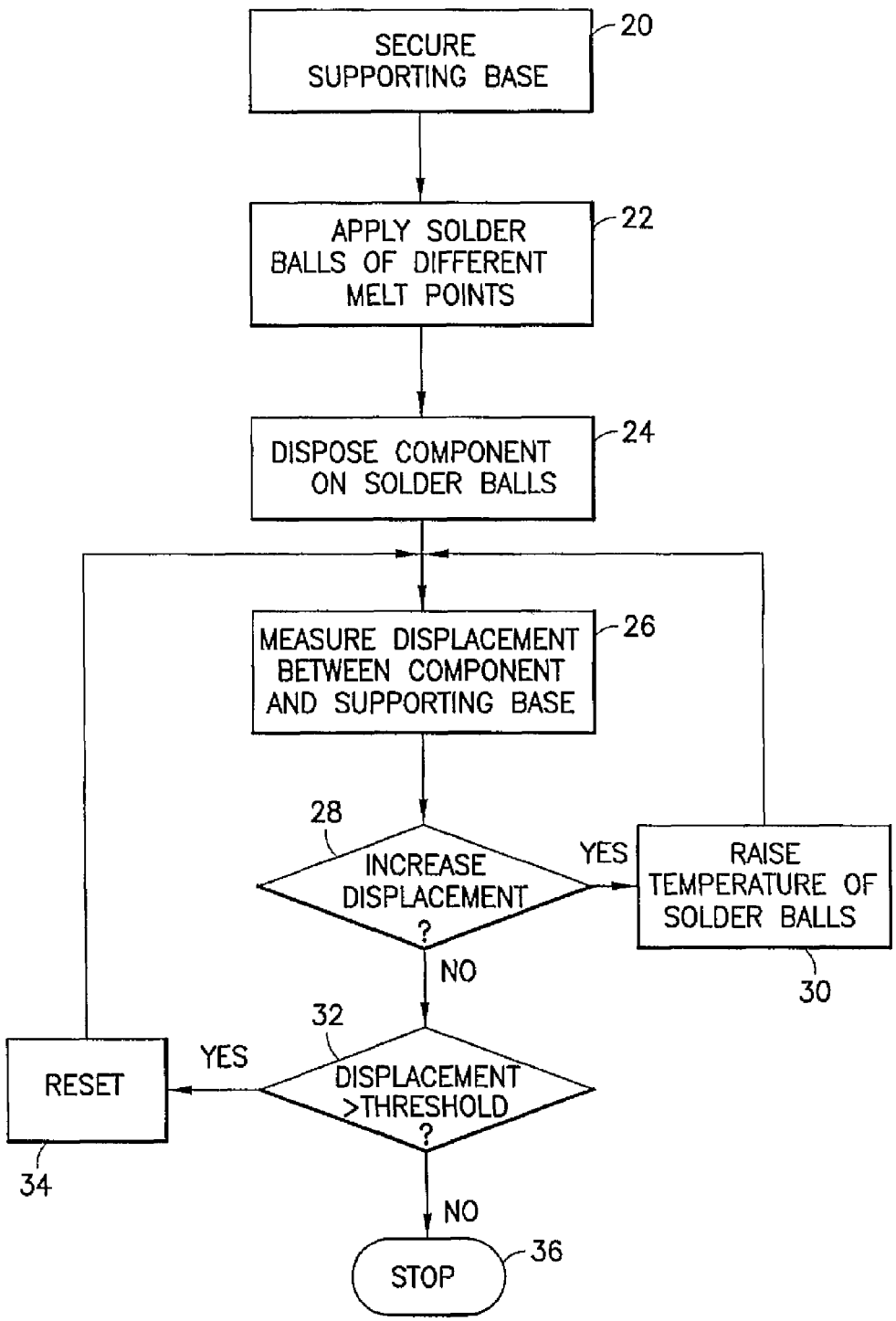
FIG. 2 illustrates another embodiment of a method of the invention.

FIG. 2 illustrates an embodiment of a method for securing a component to and finely adjusting a displacement of the component from its supporting base. Initially, the supporting base is secured 20. After proper treatment of the component mounting area, as by application of flux at designated points, solder balls are applied to the supporting base 22. The solder balls may be shaken out through a screen, applied through a screen, placed by a vacuum and/or gas jet. The component is set upon the solder balls 24 by a machine or a person. A displacement of the nearest portion of the component 12 and the supporting base 4 may be measured 26. The displacement may be the minimal distance between the component 12 and the supporting base 4. Preferably, the lower surface of the component 12 and the upper facing surface of the supporting base 4 are parallel to each other so that the minimal distance between any point of the component 12 and the supporting base 4 is the same. The solder balls 10 may be heated, along with the component 12 and supporting base 4, by being placed in an oven, through localized heating, or the like. In one embodiment, an oven is fitted with one or more movable gas circulation mechanisms to prevent the development of hot spots. The displacement distance between the component 12 and the supporting base 4 is determined by the temperature and time of heating the fusible elements 10 between the component 12 and the supporting base 4. If it is determined that the displacement should be changed 28 (i.e., increased or decreased depending upon an initial configuration), the ambient temperature is raised in a gradual fashion. Otherwise, if it is determined the displacement is excessive 32 (i.e., it surpasses a predetermined maximum threshold), the process is reset 34. In a reset, a force may be applied to the component 12 to place it farther from the supporting base 4.

If the fusible elements are not substantially uniform in composition across a bonding pad, but exhibit concentration gradients, then some areas of the bonding pad may have molten fusible elements at the melt locations before others do, and hence exerts vertical forces. These forces may be resisted by the unactivated fusible elements 10, which may stretch slightly. The net vertical deflection of the upper solid surface may depend on the spring constant, creep rate, and distribution of the solid balls 10 as well as on the number, size, and distribution of the melted (i.e., liquefied) fusible elements 10.

Figure 8A:
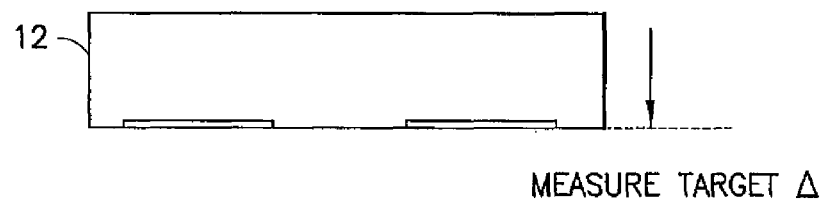
FIGS. 8A-D illustrate a method of the invention where a target offset measurement facilitates using a matching fusible element volume to achieve the target offset between the component and the supporting base.
Figure 8B:
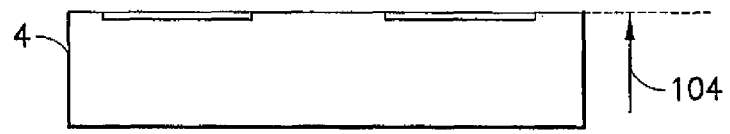
Figure 8C:
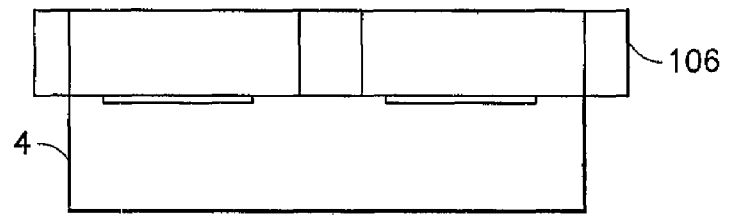
Figure 8D:
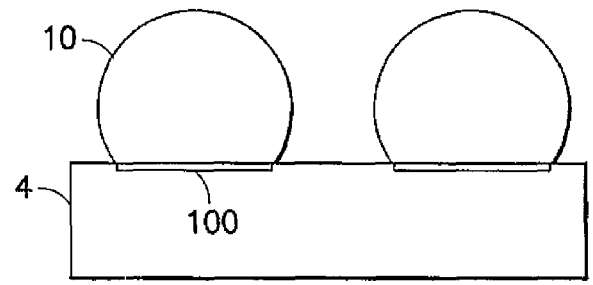

With all of the fusible elements composed of a single eutectic alloy, the fusible elements 10 solidify as one at a single temperature. A eutectic alloy is one characterized by a sharp, well-defined melting point, whereas a non-eutectic alloy exhibits an extended melting range. FIGS. 8A-8D illustrate use of a decal having the fusible elements with an offset and matching volume decal method. The method, using a eutectic solder alloy array, comprising measuring a target offset 104 as indicated by FIG. 8A between the component 12 and the supporting base 4 on which it will be placed through fusible material. The method then comprises selecting an appropriate decal containing fusible elements of the correct volume from a plurality of possible decals having different fusible element widths, heights and/or shapes. These are readily produced by the IMS solder fill process. As indicated by FIG. 8B the method then comprises applying the fusible elements to the supporting base 4 by placing the decal 106 on the supporting base 4, and by heating the fusible elements and thereafter removing the decal carrier as indicated by FIG. 8C. The fusible elements 10 remain connected to the contact pads 100 of the supporting base 4 when the decal carrier is removed. The method then comprises attaching the component 12 to the supporting base by reheating the fusible elements 10 as indicated by FIG. 8D.

Referring also to FIGS. 9A-9B and 9C-9D, a second method of using a "+" (positive) or "−" (negative) Z stop for positioning will be described, respectively. As seen in FIGS. 9A-9B, similar to that shown in FIGS. 5A-5B, the preforms 10A are located between the component 12 and the supporting base 4. The preforms 10A have a base which is larger than the contact pads 100 on the supporting base 4. The preforms have a top which is smaller than the contact pads 102 on the component 12. As the preform 10A is melted, surface tension of the fusible element with the contact pads 100, 102 cause the shape of the preforms to change as shown in FIG. 9B; the base of the fusible element 10B being reduced and the top of the fusible element 10B expanding relative to the preform 10A.

In this embodiment, this results in the decreased displacement between the component 12 and the supporting base 4. The component is moved by the fusible elements 10 towards the supporting base 4 as indicated by arrow 110. A Z stop 108 is connected to the component 12 to limit the motion of the component towards the supporting base 4. Thus, the displacement distance is limited to distance $\Delta 3$; which in this embodiment is less than the distance $\Delta 1$ in FIG. 5B.

As seen in FIGS. 9C-9D, similar to that shown in FIGS. 5C-5D, the preforms 10C are located between the component 12 and the supporting base 4. The preforms 10C have a base which is larger than the contact pads 100 on the supporting base 4. The preforms have a top which is equal to or larger than the contact pads 102 on the component 12. As the preform 10C is melted, surface tension of the fusible element with the contact pads 100, 102 cause the shape of the preform to change as shown in FIG. 9D; the base of the fusible element 10D being reduced and the top of the fusible element 10D staying the same or being reduced relative to the preform 10C. In this embodiment, this results in the increased displacement between the component 12 and the supporting base 4. The component is moved by the fusible elements 10 away from the supporting base 4 as indicated by arrow 112. A Z stop 114 contacts the component 12 to limit the motion of the component away from the supporting base 4. Thus, the displacement distance is limited to distance $\Delta 4$; which in this embodiment is less than the distance $\Delta 2$ in FIG. 5D. A fully automatic, passive alignment system may use a mechanical stop, which forces the motion to terminate at a desired location, or the heating may be terminated when the desired position has been reached. A mechanical stop can be provided by a template, representing a reference part of known dimensions. One example is the alignment of a single-mode fiber ribbon cable connector, in which the template represents the ideal mating connector. In this type of application, the portion(s) of the connector that touch the template and cause the motion to stop have positions accurately known with respect to alignment points, e.g., the fibers have a repeatable outer diameter and concentricity—otherwise, they may be aligned very precisely to the wrong position. A three-point electrical connection may be used alternatively.

Accuracy and consistency of bond pad diameter is very important for the eutectic method described with reference to FIGS. 8A-8D since the matching volume decal assumes precise and consistent bond pads. The eutectic method referred to in FIGS. 9A-9D is more forgiving of bond pad diameter precision, since it "freezes" the desired offset in place by solidifying the fusible elements. If an optical coupling feedback loop is operated during the Z motion, the optimal precision in the offset may be achieved with this eutectic method.

Two temperatures are of concern for non-eutectic alloys: the solidus temperature and the liquidus temperature. The solidus temperature represents beginning of softening or, in a phase diagram, a transition temperature of a material below which the material is in a solid phase. The liquidus temperature represents full melting or, in a phase diagram, a transition temperature of a material above which the material is in a liquid phase. When a non-eutectic (or, off-eutectic) alloy freezes, one component of the alloy solidifies at one temperature and the other at a different temperature. Bonding techniques using fusible elements with eutectic or near-eutectic compositions have the disadvantage that when the last solder ball melts, the motion is rapid and possibly uncontrolled. The sudden and uneven melting of eutectic solders causes the well-known "tombstone effect" in soldering surface-mount resistors and capacitors. Eutectic paste melts all at once, and if one end of the component wets before the other, the resulting unbalanced surface tension force can pull the one end up into the air, causing an open circuit fault. Effects of this sort can be reduced or eliminated by using off-eutectic or non-eutectic solders, so that the motion occurs in temperature ranges between the solidus temperature of the highest-melting balls and the liquidus of the lowest-melting ones. Since solidus temperatures tend to be relatively constant with respect to composition, there should always be significant overlap between the semi-melted ranges of similar solder alloys.

If the two solids are initially in contact, then from the lowest liquidus to the highest one, the facing (or, lower) surface of the component moves by the full range of the ball growth, such as by 100 microns, with respect to the facing (or, upper) surface of the supporting base. During the transition from solidus to liquidus, the semi-melted solder contains dendrites of higher-melting point alloy containing liquid lower-melting point alloy. The result is that the surface tension is suppressed by the action of the dendritic scaffold. This scaffold makes the surface tension of the semi-melted solder small near the solidus temperature, increasing towards a peak at or slightly above the liquidus temperature. The exemplary embodiments of this invention exploit these characteristics to change the force applied to the surface by changing the temperature excursion, and hence to change the position of the component such that the upper surface The coefficient of thermal expansion (CTE) of the fusible elements is typically so small as to not be a useful effect for Z-axis positioning. However, by varying at least one of the shape, distribution, and size of the fusible elements of the different compositions, it is possible to tailor the Z vs. T and t (axial displacement with respect to temperature T and time t) relationship to a desired characteristic, and hence to cause the upper surface of the component to move a desired amount, or to a desired position, by control of the temperature vs. time.

In a lead-tin system, the fusible elements 10 may be different alloys, such as 63Sn for the lowest melting, and 40Sn or 85Sn for the highest melting point material, as non-limiting examples. Examples of solder alloys that have the same solidus temperature but different liquid temperatures, useable with the invention, include Sn3.60Ag1.00Cu (Tsolidus=217° C., Tliquidus=217.9° C.), Sn3.59Ag0.99Cu0.15Co (Tsolidus=217° C., Tliquidus=218.5° C.), Sn3.59Ag0.99Cu0.30Co (Tsolidus=217° C., Tliquidus=219.3° C.), Sn3.58Ag0.99Cu0.45Co (Tsolidus=217° C., Tliquidus=218.9° C.), and Sn4.68Ag1.69Cu0.30Co (Tsolidus=217° C., Tliquidus=218.1° C.).

Thermal expansion should be allowed for, and may be accomplished by one calibration run per peak reflow temperature. The Z motion is mostly constrained by the volume of solder and the force of surface tension. As was noted above, between its solidus and liquidus temperatures, solder is in a semi-melted state and contains a network of dendrites of the higher melting point phase surrounded by a liquid of lower melting point phase. The two phases differ in composition—in ordinary tin-lead solder, the liquid has nearly the eutectic (63Sn-37Pb) composition, and the dendrites are tin-rich or lead-rich, depending on which side of the eutectic composition the fusible element is on. The dendrites form a scaffolding that prevents the surface tension of the liquid from collapsing the fusible element 10 into its equilibrium shape, so in the semi-melted region fusible element 10 deforms easily but exerts almost no force due to surface tension. The liquid fusible element's surface tension is the major driver of the Z motion. Where the equilibrium Z displacement is determined depends on the balance between the surface tension force and the preload force, either due to gravity or externally applied.

In certain embodiments, an even distribution of fusible elements on a bonding pad may be provided so that the every point of the component is displaced from the supporting base by the same amount. In other embodiments, fusible elements of a first liquidus temperature may be disposed at one end of a bonding pad and fusible elements of a second liquidus temperature at a second end of a bonding pad to permit tilting of a component 12 with respect to the supporting base 4. This is merely an alternative. In a preferred method tilting is not provided.

Application of a mechanical preload to a variable-force actuator, such as an array of solder balls 10, may result in repeatable motion as a function of temperature excursion, followed by solidification in the new position. Some backlash in the motion may occur, because during solidification the normal force may change slightly, resulting in a slight change of equilibrium position.

Stepwise Motion

Due to the rapid increase of normal force at the liquidus temperature, a set of solder balls 10 of a given composition on a supporting base 4 begins producing significant motion when it reaches its liquidus temperature. A solder ball array of N different compositions (and hence different liquidus temperatures) thus tends to produce motion occurring in N steps, assuming that the liquidus temperatures are well-separated. This can be used to advantage, for example, in optical alignment applications, because the number of steps for a given temperature excursion are well-defined, even if the liquidus temperatures are not perfectly consistent from batch to batch. This allows alignment to be done by measuring the initial offsets from the desired position, and then moving the component by a predetermined number of vertical position step increments to compensate for the misalignment. With this embodiment, the electrical function of the fusible elements are preferably provided for by the lowest melting temperature alloy fusible elements; the first to be connected. The additional higher melting temperature alloy fusible elements are preferably strictly for mechanical function. This is not the case with eutectic methods. With the invention, the movement of the two surfaces may be controlled such that an intermediate displacement between the two surfaces may be obtained controlling bonding process of the component to the supporting base in which fine displacement adjustments of, for example, one micron, may be obtained by controlling the temperature of the fusible elements during the bonding process.

Figure 4A:
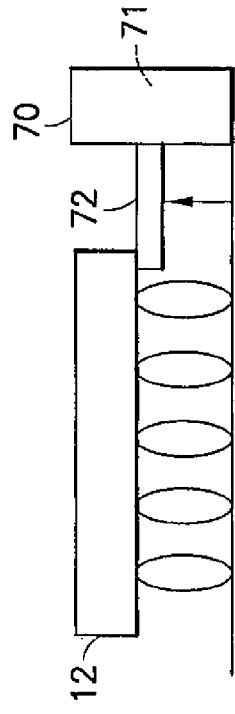
FIGS. 4A to 4F illustrate an embodiment of a method of the invention with a reset mechanism.
Figure 4B:
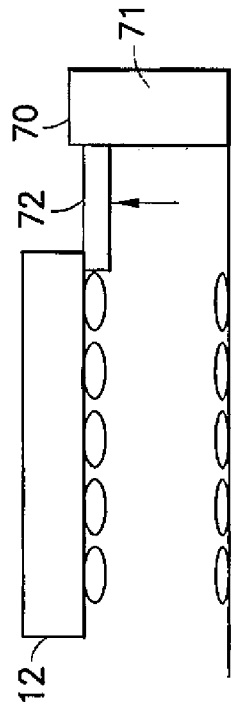
Figure 4C:
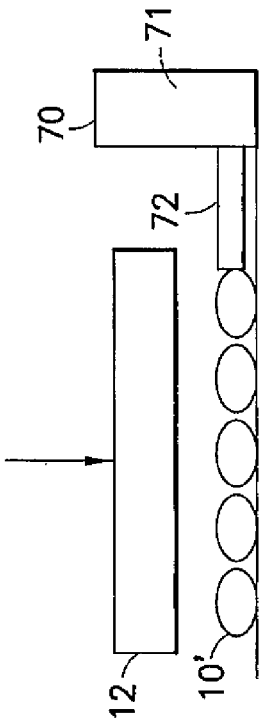
Figure 4D:
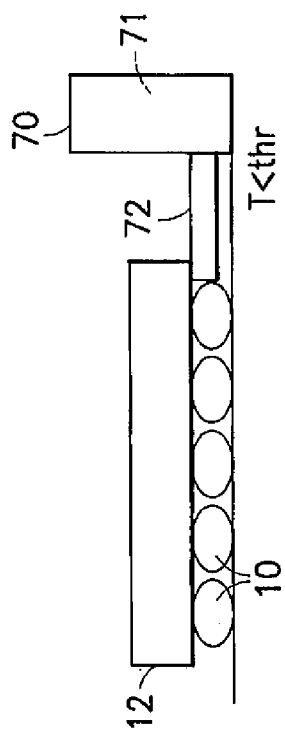
Figure 4E:
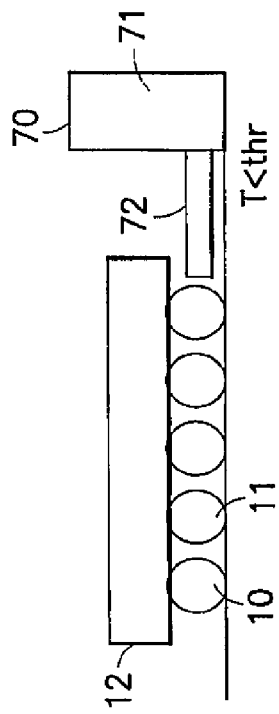
Figure 4F:
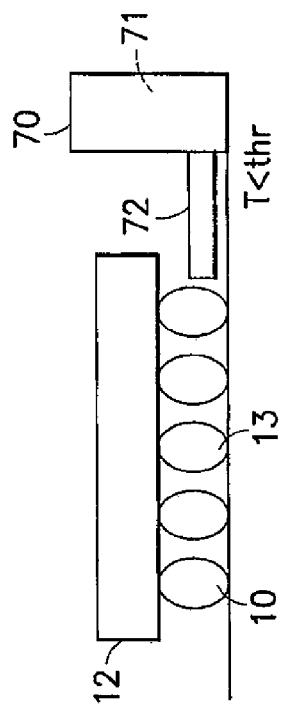

A bimetallic snap diaphragm or other thermally controlled activator may be used to provide a positive reset action to return the system to its original position. To do this, a snap action bimetallic diaphragm whose trip temperature is above the highest liquidus temperature, and whose reset temperature is below the lowest liquidus temperature, and below at least some solidus temperatures, may be employed. Heating the assembly to the trip point makes the diaphragm snap, forcing the surfaces apart and holding them there until the assembly goes below the reset temperature. A bimetallic snap diaphragm or other thermally controlled activator may also be used to provide a negative reset action to help in returning the system to its original position In FIGS. 4A-4E a bimetal apparatus can be used to provide a reduction of the displacement distance. In FIG. 4A, a bimetallic snap diaphragm 72 extends from a support 70. The support 70 may allow the diaphragm 72 to be positioned in a fixed and parallel manner about both the component 12 and the supporting base 4 in which a gap exists between the top surface of the component 12 and the bottom of the diaphragm 72. FIGS. 4B and 4C illustrate the closing of the gap as heat is applied to the fusible elements 10, 11, and 13 in which a increasing number 11, 13 of the fusible elements 10 melt and direct increasing force between the component 12 and the supporting base 4. During this process, the temperature of the diaphragm 72 is likewise increased. At or just beyond the threshold temperature (thr), as shown in FIG. 4D, the diaphragm 72 bends upward. Since it is attached to the component 12, it increases the displacement between the component 12 and the supporting base 4, in effect separating the component from the supporting base. At the reset temperature of the diaphragm, the diaphragm 72 releases from the component 12. At this point the fusible elements previously connecting the component to the supporting base have been separated. This permits preparation for a reset condition as shown in FIG. 4E.

Thermally Activated Reset

The non-eutectic stepwise z actuation noted above works only when the component is initially joined to the supporting base. This is because the fusible elements have not joined to component bond pads, but do so sequentially during the initial join cycle. After thermal reset, however, all bond pads on both the component and the supporting base sides have been wetted and, when solidifying after reset, are in the state described above. When activated, the thermal reset process separates the component and supporting base, allowing for the fusible elements (solder) and residues to be removed from all bond pads, and a fresh array of non-eutectic fusible elements to be applied. This results in the initial joining condition.

Passive Fine Alignment

The exemplary embodiments of this invention have been described thus far as an actuator system, which is one component of a fine alignment system. A fully automatic, passive alignment system may use a mechanical stop, which forces the motion to terminate at a desired location, or the heating may be terminated when the desired position has been reached. A mechanical stop can be provided by a template, representing a reference part of known dimensions. One example is the alignment of a single-mode fiber ribbon cable connector, in which the template represents the ideal mating connector. In this type of application, the portion(s) of the connector that touch the template and cause the motion to stop have positions accurately known with respect to alignment points, e.g., the fibers have a repeatable outer diameter and concentricity—otherwise, they may be aligned very precisely to the wrong position. A three-point electrical connection may be used alternatively.

Another approach is implemented by the use of a three-point electrical connection, which is made when the surfaces come into the proper orientation. Such a connection would be particularly useful for alignment.

Other Embodiments

Other embodiments of the invention are contemplated. In one embodiment, the apparatus, supporting base, and component may be disposed in an environment with gas mixtures other than air and/or gas pressures of other than one atmosphere at sea level. Polymer core solder balls may be used for at least a portion of the fusible elements 10 in another embodiment. Further, the fusible elements 10 may be individually non-eutectic or may be a mixture of fusible elements, each of uniform composition, that collectively are non-eutectic. In an alternative embodiment the fusible elements may be all eutectic as described, with decals of various volumes that are matched to the target offset. In an embodiment, the component 12 and its supporting base 4 may be bonded with a desired displacement according to the exemplary embodiments of the invention, and then further bonded to another supporting base to achieve multi-layered precision alignment and/or to allow for precision alignment in multiple dimensions. In an embodiment, the fusible elements may be provided already attached to the component through an adhesive and/or by being partially melted to adhere to the component in which case placement of the component would entail matching the fusible elements with the corresponding bonding pad.

It is believed that the exemplary embodiments of the invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form herein before described being explanatory embodiments thereof. It is the intention of the following claims to encompass and include all modifications to the teachings above.

We claim:

1. A method, comprising:

providing an adjustable structure comprising a substrate and a component to be bonded to and aligned using a stepwise motion relative to one surface of said substrate using fusible elements comprising different non-eutectic solder materials, each non-eutectic solder material having a liquidus transition temperature that is distinct from its solidus temperature, wherein the liquidus transition temperature of one of the non-eutectic solder materials is distinct and separated based on a predetermined criterion from the liquidus transition temperature of any other of the non-eutectic solder materials; and aligning said component relative to a surface of the substrate during a bonding process to compensate an initial offset from a desired position, wherein the aligning of said component is performed by measuring the initial offset from the desired position defined by an offset between the liquidus transition temperatures of the fusible elements and moving the component by a predetermined number of vertical position step increments which results in a bond of the component to the substrate.

2. The method of claim 1, wherein at least one of the fusible elements has a shape of a star, or comprises a hole or a void.

3. The method of claim 1, wherein an electrical function for bonding of the component to the surface of the substrate is provided by one-type of the fusible elements comprising one of the non-eutectic solder materials, each fusible element of the one-type fusible elements having the lowest liquidus transition temperature among the different non-eutectic solder materials, and a mechanical function for the aligning of the component to the one surface of the substrate is provided by a further type of the fusible elements comprising a different one of the non-eutectic solder materials, each fusible element of the further typo having the liquidus transition temperature higher than the one-type.

4. The method of claim 1, wherein the melting is provided by heating using an oven.

5. The method of claim 1, wherein the component comprises an optical element.

6. The method of claim 1, wherein the component comprises a mechanical element.

7. The method of claim 1, wherein the component comprises an electronic element.

8. A method, comprising:

providing an adjustable structure comprising a substrate and a component to be bonded to and aligned using a stepwise motion relative to one surface of said substrate using fusible elements comprising different non-eutectic solder materials, each non-eutectic solder material having a liquidus transition temperature that is distinct from its solidus temperature, wherein the liquidus transition temperature of one of the non-eutectic solder materials is distinct and separated based on a predetermined criterion from the liquidus transition temperature of any other of the non-eutectic solder materials;

aligning said component relative to a surface of the substrate during a bonding process to compensate an initial offset from a desired position, wherein the aligning of said component is performed by measuring the initial offset from the desired position defined by an offset between the liquidus transition temperatures of the fusible elements and moving the component by a predetermined number of vertical position step increments which results in a bond of the component to the substrate, and wherein a reset mechanism is configured to reset a displacement between the substrate and the component, wherein the reset mechanism comprises a thermally controlled activator at least partially disposed between the substrate and the component.

9. The method of claim 1, wherein a stop mechanism is configured to prevent a displacement between the component and the substrate from exceeding a predetermined threshold.

10. The method of claim 1, wherein at least one of the fusible elements has a shape of a ball.

* * * * *